United States Patent [19]

Dozier

[11] 4,142,176
[45] Feb. 27, 1979

[54] SERIES READ ONLY MEMORY STRUCTURE

[75] Inventor: Harold W. Dozier, Carrollton, Tex.

[73] Assignee: Mostek Corporation, Carrollton, Tex.

[21] Appl. No.: 726,579

[22] Filed: Sep. 27, 1976

[51] Int. Cl.² .............................................. G11C 7/00
[52] U.S. Cl. .......................... 340/166 R; 340/166 FE
[58] Field of Search ..................... 340/166 R, 166 FE; 365/104

[56] References Cited

U.S. PATENT DOCUMENTS

| | | | |
|---|---|---|---|
| 3,613,055 | 10/1971 | Varadi | 365/104 |
| 3,728,696 | 4/1973 | Polkinghorn | 365/104 |
| 4,006,470 | 2/1977 | Mitarai | 340/166 R |
| 4,059,826 | 11/1977 | Rogers | 340/166 R |

Primary Examiner—Harold I. Pitts
Attorney, Agent, or Firm—James J. Mullen

[57] ABSTRACT

A read only memory (ROM) structure in which a plurality of enhancement and depletion transistors are organized into a series-connected NAND logic matrix. The usual metal-to-diffusion contacts required for every one or two bits, as well as interweaved power supply lines required for every two row lines in conventional NOR logic circuits are not used in the series arrangement thereby minimizing the geometry of the ROM structure. In a preferred embodiment, logical information is stored within the ROM matrix by means of silicon gate metal oxide semiconductor field effect transistors which are arranged into a matrix having a number of common gate input rows and a number of series connected output columns which correspond to selected logic combinations of the inputs. The logical content of individual memory cells within the matrix is determined by providing either enhancement mode or depletion mode MOSFET transistors as elements of the matrix.

10 Claims, 10 Drawing Figures

SERIES READ ONLY MEMORY STRUCTURE

BACKGROUND OF THE INVENTION

1. Field of the Invention:

This invention relates generally to digital data processing systems, and in particular, to a read only memory (ROM) fabricated with insulated gate field effect transistors such as metal oxide semiconductor field effect transistors (MOSFET) in integrated circuit form.

2. Description of the Prior Art:

The logic of any data manipulating system may be partitioned into control logic and data path logic. In conventional arrangements the control logic is constructed in a matrix of Boolean logic gates. This matrix translates function codes, sequence counts, and other information about the state of a data path logic into control levels, or if gated with a timing pulse, into control signals. According to certain control logic arrangements, for example microprogramming, the control logic is implemented by a read only memory, the outputs of which become the control levels or, if gated with a timing pulse, the control signals for the system. Among the several advantages which microprogramming offers is the minimum geometry afforded by the control logic which is contained in a memory element which is relatively densely packed.

Of particular interest to the present invention is a read only memory in which the memory elements are comprised of MOSFET devices. The designation MOSFET refers to a class of semiconductor devices which includes, for example, a field effect transistor having a metal gate or other conductive material insulated from a silicon or other semiconductor substrate by an oxide or other insulating layer. Other known MOSFET devices utilize an insulating layer such as silicon nitride as opposed to an oxide layer. Thus the term MOSFET, or simply MOS as may be used herein, is used in the general or generic sense and indicates a general class of devices which may be otherwise referred to as field effect devices, insulated gate devices and/or surface effect devices. Such devices may be physically characterized as having first and second regions of a first conductivity type separated by an intermediate region of the opposite conductivity type, over which an insulated gate is disposed. By applying a voltage of the proper polarity to the gate, the surface of the intermediate region is effectively caused to change conductivity type between the first and second regions.

It is well known in the art that circuit logic functions may be implemented by MOS devices. In particular, complex MOS logical circuits may be constructed from basic logic blocks such as NAND and NOR gates. The parallel arrangement of MOS devices in a simple NOR circuit lends itself well to MOS integrated circuitry, as disclosed in U.S. Pat. No. 3,541,543. In such parallel integrated circuitry, it is apparent that available space may be utilized more efficiently through the use of shared diffused regions and the inherent self-isolation properties of MOS devices. However, in conventional silicon gate read only memory structures in which simple NOR logic is utilized, one metal-to-diffusion contact is required per ROM bit or per two ROM bits. Also, one interweaved power supply line is required for every two row lines. In conventional metal gate read only memory structures in which simple NOR logic is utilized, one power supply line is required for every two column lines.

There remains considerable interest in minimizing the geometry of ROM structures to provide improved performance and higher packing density. The following patents illustrate the state of the logic circuit art in which MOSFET devices are utilized to achieve these and other objects: Rizzi et al. U.S. Pat. No. 3,733,690 discloses a read only memory matrix having back-to-back PN junctions between each inner section of rows and columns. One junction of selected connections are electrically shorted to program the ROM by establishing single diode or junction connections at predetermined intersections. Heimbigner U.S. Pat. No. 3,746,882 teaches the use of field effect transistors with series connected gates in an input synchronizing circuit having NAND gates. Proebsting U.S. Pat. No. 3,775,963 teaches the use of enhancement and depletion field effect transistors with series connected gates in a logic inverter for integrated circuits. NAND gates are formed by providing additional enhancement mode devices between the output of an inverter stage and the source voltage. Mai et al U.S. Pat. No. 3,898,105 discloses method and structure related to MOS devices suitable for use as matrix elements in a ROM constructed according to the teachings of the present invention.

SUMMARY OF THE INVENTION

Further reduction in the physical size of a read only memory (ROM) bit comprising a matrix of MOSFET devices, other than by reducing the geometry of the various MOS components, can be accomplished by altering the logical structure of the ROM. According to conventional silicon gate ROM arrangements, one metal-to-diffusion contact is required per one ROM bit or per two ROM bits. Also, one power supply line is required per two row lines. However, by logically rearranging the ROM as a series structure (NAND/AND logic) rather than the conventional parallel structure (NOR/OR logic), the interweaved power supply lines are eliminated and the metal-to-diffusion contacts required in conventional silicon gate structures are eliminated, thereby providing a substantial reduction in the physical size of a single bit.

According to one aspect of the present invention, a logic matrix structure constructed according to the teachings of the present invention includes a semiconductor substrate and a matrix of insulated gate field effect transistors formed at selected locations on the substrate. The transistors are arranged in an array of input rows and output columns which correspond to predetermined logic combinations of inputs. The MOSFET transistors are connected in series as driver elements, instead of in parallel as in conventional NOR/OR logic arrangements. This is accomplished by forming the gate of the transistors of each input row in common and by connecting the drains of the transistors within each output column in series electrical relation with the sources of adjacent transistors in each column. This arrangement provides a gate controlled, series conduction path through each output column of transistors.

Logic programming of the matrix may be realized by providing predetermined ones of the MOS elements of the matrix with structurally differentiated portions with respect to the remaining elements. The transistors of the matrix may be identified as elements of first and second sets, the elements of each set including structurally differentiated portions which provide first and second modes of operation, respectively. For example, the elements of the first set may have structurally differentiated portions relative to the elements of the second set which permit operation of the transistors of the first set in the first mode in which current is conducted through source and drain portions in response to a first applied gate potential corresponding to a first logic state, (for example $V_D$ volts for a logic "1" for N-channel enhancement mode MOSFET devices), and in which the flow of current through the source and drain is prevented in response to a second applied gate potential corresponding to a second logic state, (for example zero gate bias for a logic "0"). The elements of the second set may have structurally differentiated portions which permit operation of the elements of the second set in the second mode wherein a conductive path through source and drain portions exists without regard to the logic state corresponding to the applied gate potential, (for example, depletion mode MOSFET devices).

According to a preferred embodiment of the present invention, the MOSFET devices of the logic matrix are enhancement mode and depletion mode MOSFET transistors connected in series as driver elements. Reading the array to determine the logical content of a particular memory cell can be accomplished by selectively bringing one row line "low" so that all enhancement transistors controlled by that line become non-conductive. All other rows are maintained in "high" condition. Thus if a particular column line has an enhancement transistor whose gate is controlled by a selected row line, that series path would be broken. If that column line had a depletion transistor instead of an enhancement transistor, the series path would remain unbroken. Differentiation between a logical "one" and a logical "zero" is therefore accomplished by sensing whether the series path is open or conducting.

In accordance with another aspect of the invention, logic programming of the ROM matrix is provided by a diffused bridge region electrically interconnecting the source and drain portions of predetermined ones of selected transistors within each column, the source and drain portions being essentially short circuited, thereby rendering those transistors continuously conductive and non-responsive to gate signals.

The foregoing and other objects, advantages and features of this invention will hereinafter appear, and for purposes of illustration, but not of limitation, an exemplary embodiment of the subject invention is shown in the appended drawing.

DETAILED DESCRIPTION OF THE INVENTION

The present invention is a read only memory (ROM) structure which comprises a logic matrix of MOSFET elements arranged in an array of input rows and output columns which correspond to predetermined logic combinations of inputs. The entire memory as disclosed herein may be fabricated on a single semiconductor chip and is primarily intended for such fabrication, although fabrication of the memory with one or more circuits, or their equivalent as independent circuits connected to the integrated memory is also a practical realization of the present invention.

Figure 1:
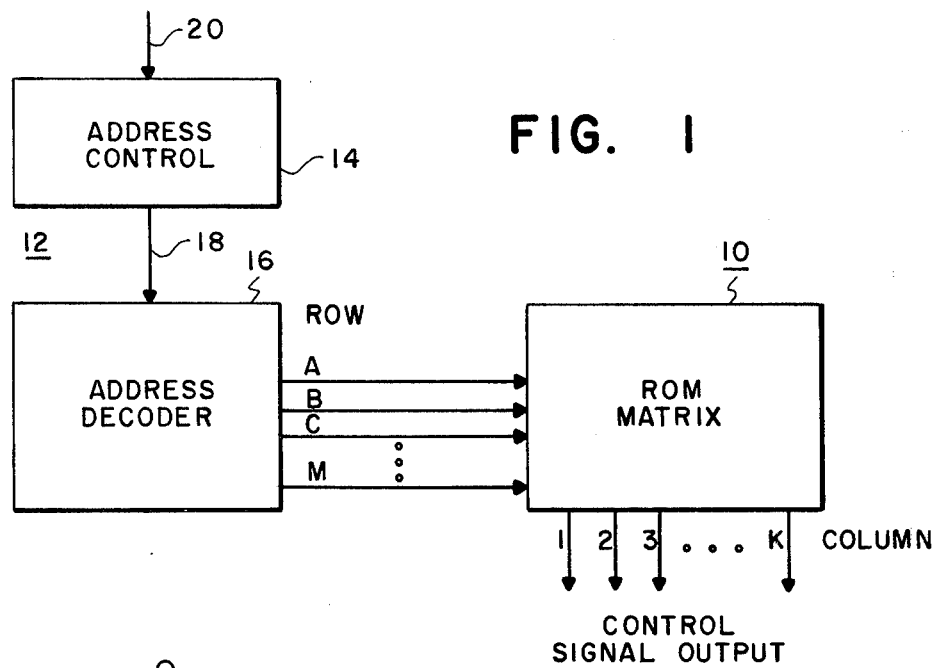
FIG. 1 is a block diagram of a typical memory matrix and addressing system therefore.

Referring now to FIG. 1, a conventional inter-connection of a ROM memory matrix 10 and an addressing system 12 is shown which includes an address control 14 and an address decoder 16. To address a particular cell or set of cells in the memory matrix 10, address signals 18 are applied through the address decoder 16 and appear as row inputs A, B, C, ..., M to the ROM matrix 10. The address control 14 and address decoder 16 may be provided by conventional circuits which in combination are operable to select an individual memory cell or set of cells from the ROM memory matrix 10 for reading in response to a digital addressing signal 20. In addition to the addressing signal 20, there may also be provided additional circuitry for coordinating reset signals and clock signals (not shown).

The ROM matrix 10 illustrated in FIG. 1 is organized into an array of M input rows and K output columns. The read only memory 10 is a special storage device in which logic information (0's and 1's) is permanently stored. The information stored in the ROM 10 can be altered or replaced only by changing a physical connection or by replacing or modifying some physical part of the system. The storage of logic information within the ROM matrix shall be hereinafter referred to as "programming".

Figure 2:
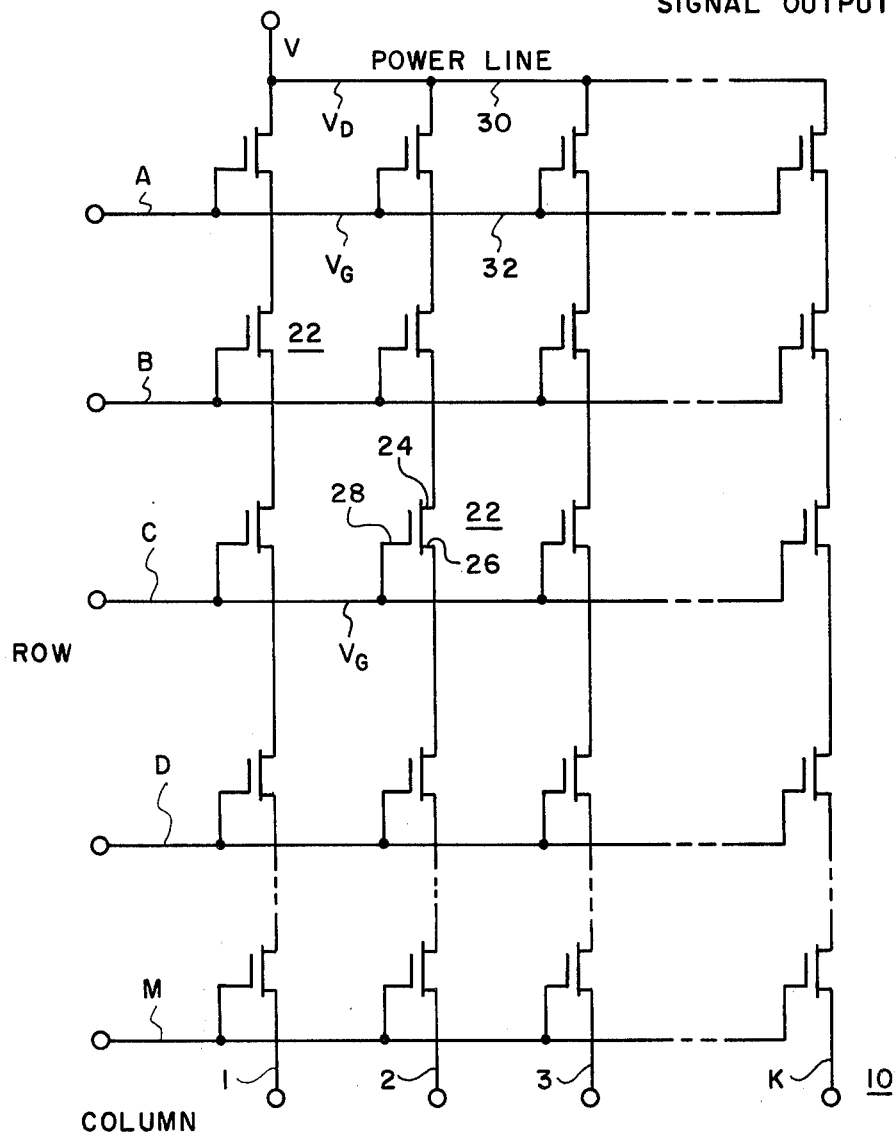
FIG. 2 is a circuit diagram of an MxK ROM memory matrix constructed according to the teachings of the present invention.

Referring now to FIG. 2 of the drawing, a novel circuit structure for the implementation of the ROM matrix 10 is illustrated. The ROM 10 is an MxK array of MOSFET elements 22 which are arranged in a number M of input rows and a number K of output columns corresponding to selected logic combinations of the inputs. As discussed above, the MOSFET elements 22 are devices of the insulated gate type whereby conduction between first and second regions in a semiconductor is controlled by the voltage on an insulated gate. In the circuit shown in FIG. 2, the first and second regions are represented by electrodes 24 and 26 which correspond in the MOSFET device to source and drain regions, respectively, the insulated gate being represented by a gate electrode 28. In the preferred embodiment of the present invention all of the circuits described herein are fabricated of N-channel MOS devices, although it is to be understood that the circuits and principles of the present invention are also directly applicable to P-channel devices.

The MOS transistors 22 formed under the gate strip 28 between the diffused drain and source regions 24 and 26, which are representative of all of the transistors within this particular array, exhibit a finite resistance when energized by the reference voltages $V_D$ and $V_G$. The MOS transistors 22 are logically responsive devices of the type which do not conduct when the gates are at a potential corresponding to a logic "0" level, but do conduct when a voltage corresponding to a logic "1" level is applied to the respective gates. Thus, if any one of the inputs A, B, C, . . ., M is a voltage corresponding to a logic "1" level, the corresponding MOS transistors whose gates are energized by this potential become conductive, thereby establishing a conductive circuit through a portion of its associated column line.

In a practical read-only memory circuit, selected ones of the transistors 22 within the MxK array 10 are programmed, that is, structurally differentiated with respect to each other so that a conductive path continuously exists between the source electrodes 24 and drain electrodes 26 of the selected transistors and thereby become logically nonresponsive to the reference potential $V_G$ applied to the gate electrodes 28. Reading the ROM 10 to determine the memory content of a particular MOS element 22 is accomplished by selectively bringing one of the row lines A, B, C, . . ., M "low", i.e. to substantially zero potential, so that all of the logically responsive MOS elements controlled by that particular row line become nonconducting. A logic "1" voltage is applied to the remaining row lines. Thus, if a particular column line has a logically responsive transistor whose gate is cntrolled by the selected row line with the "low" voltage applied, that series path is broken. If, however, that column line had a MOS element whose structure was differentiated so that it was rendered continuously conductive and logically nonresponsive to the logic condition of the gate, the series path would remain unbroken. In such an arrangement, differentiation between a logic "1" and "0" is therefore accomplished by sensing whether the series column line is open or conducting.

The ROM 10 may be constructed according to conventional fabrication techniques and includes a semiconductor substrate and a matrix of insulated gate field effect transistors formed at selected locations upon the substrate. The transistors 22 are arranged in an array of the input rows A, B, C, . . ., M and output columns 1, 2, 3, . . ., K which correspond to predetermined logic combinations of the inputs. The transistors 22 are connected in series as driver elements, instead of in parallel as in conventional nor/or logic arrangements. The gates 28 of the transistors of each input row are fabricated as common strips, and the drains 24 of the transistors are joined in common with the sources of adjacent transistors in each output column so that a series electrical connection is established between the sources and drains of adjacent transistors in each column. This arrangement provides a gate-controlled, series conduction path through each output column of transistors.

Figure 3:
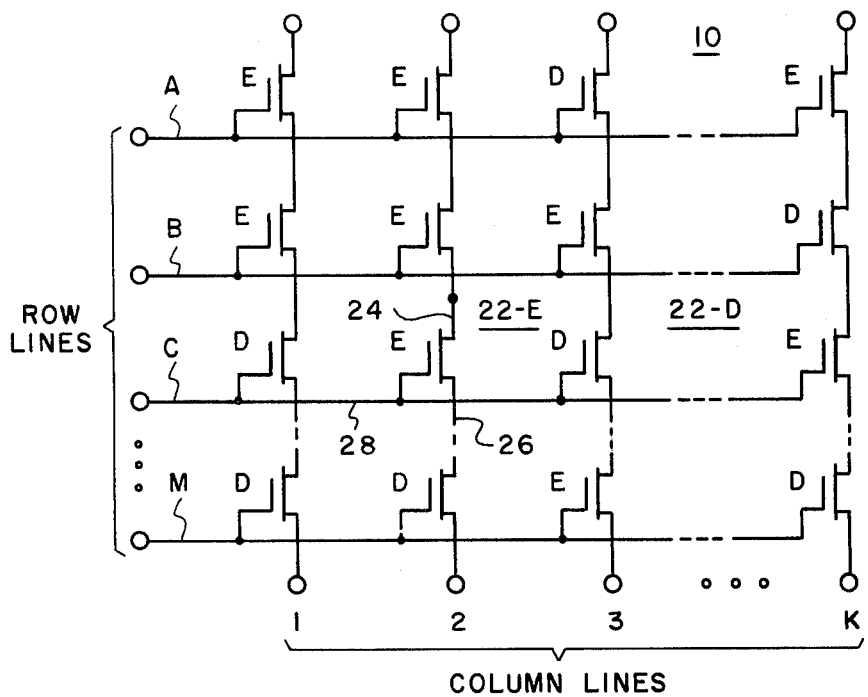
FIG. 3 is a circuit diagram of a logic matrix which is programmed by enhancement mode and depletion mode MOSFET devices.

The logic memory of each matrix element 22 is programmed by structurally differentiating predetermined ones of the matrix elements at preselected locations within the matrix 10. According to an important embodiment of the present invention, the logic programming of the array 10 is provided by enhancement mode and depletion mode MOSFET transistors which are connected together in series as driver elements in the column lines 1, 2, 3, . . ., K. A simplified electrical schematic diagram of this arrangement is shown in FIG. 3 of the drawing. The symbols E and D respectively refer to enhancement mode and depletion mode MOSFET devices. Conventional ion implantation techniques are utilized to provide depletion mode and enhancement mode transistors on the same substrate as disclosed in U.S. Pat. No. 3,898,105. Typical operating characteristics of enhancement and depletion mode devices suitable for operation in the circuit of the present invention are described in detail in standard texts such as MOSFET IN CIRCUIT DESIGN by Robert H. Crawford, McGraw-Hill Book Company, 1967.

The transistor elements of the first and second distinct types form two sets, i.e. a first set of logically responsive elements and a second set of logically nonresponsive elements. The two distinct types may be formed by variations of the conventional ion implantation techniques. For example, the structural differentiation may be provided by implanting the channel regions of both transistor types with ion impurities of different concentration levels, or both types may be implanted with ion impurities of different conductivity types. Structural differentiation of one type relative to the other may also be provided by implanting ion impurities in the channel region of the elements of one of the sets but not in both sets.

The fundamental difference in operation of the enhancement mode transistors 22E and the depletion mode transistors 22D is that in operation of the enhancement mode MOSFET, a finite potential must be applied to the gate before significant current will flow from the source to the drain. In depletion mode devices, significant current flow occurs at zero gate bias. This distinction in operating characteristics is utilized in one embodiment of the invention to provide the logic programming of the ROM matrix 10. Reading the matrix array 10 is accomplished by selectively bringing one of the row lines A, B, C, . . ., M to a logic "low" such that all enhancement transistors 22E controlled by that line become nonconducting. All other row lines are maintained at a logic "high" condition. Thus if a particular column line has an enhancement transistor 22E whose gate is controlled by the selected row line, that series path would be broken. On the other hand, if that column line had a depletion transistor 22D instead of an enhancement transistor, the series path would remain unbroken. Differentiation between a logic "1" and a logic "0" is therefore accomplished by sensing whether the series path is open or conducting.

Figure 6:
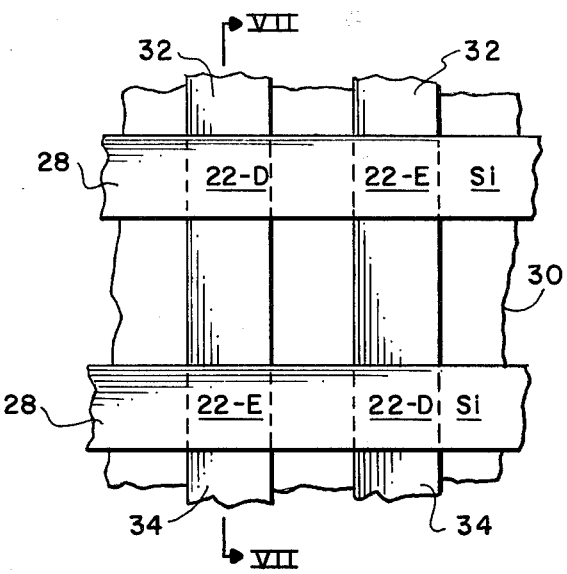
FIG. 6 is a substrate layout schematic view of the integrated structure shown in FIG. 3.
Figure 7:
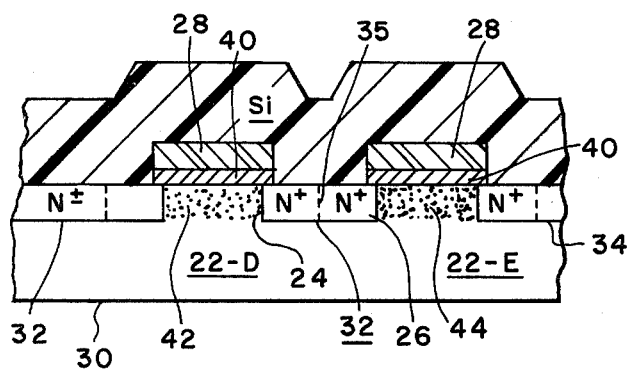
FIG. 7 is a sectional view of the structure shown in FIG. 6, taken substantially along the line VII—VII.
Figure 9:
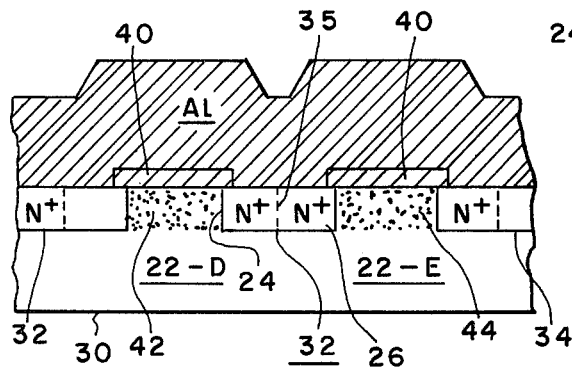
FIG. 9 is a sectional view of the structure shown in FIG. 8 taken substantially along the line IX—IX; and, FIG. 10 is an electrical schematic diagram of a plurality of series ROM structures connected in parallel to form a single bit line.
Figure 8:
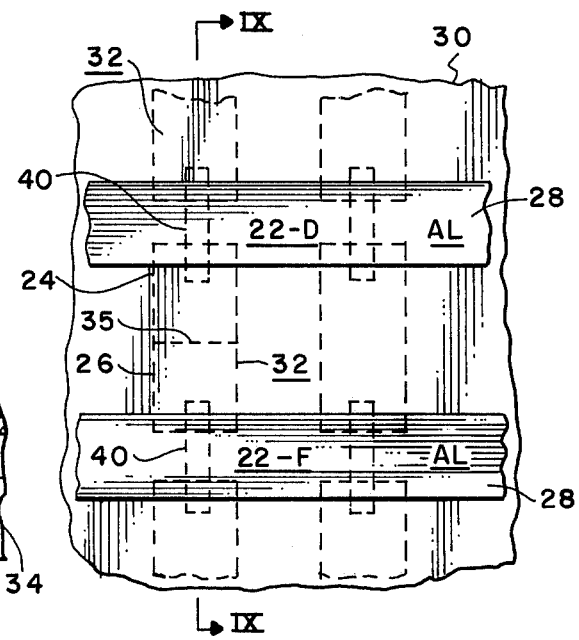
FIG. 8 is a substrate layout similar to FIG. 6 of an integrated structure having a metal gate.

The layout of the series connected ROM structure which utilizes enhancement mode and depletion mode transistors is illustrated in FIGS. 6 and 7 of the drawing. In FIG. 6, a memory cell consists of three layers fabricated upon a P-doped substrate 30. The first layer is the $N^+$ diffusion regions 32, 34 which comprise the series connected drain and source regions of adjacent transistors in each column. A dashed line 35 indicates a hypothetical division between the drain and source regions of adjacent transistors in each column for purposes of discussion; however, in a practical device so connected the drain region and source regions of next adjacent transistors comprise a unitary diffusion region. The second layer includes a thin layer of insulating oxide 40. The third layer includes the polysilicon gate row line 28. The thin insulating oxide layer 40 is disposed intermediate of the polysilicon gate 28 and the ionized channel regions 42 and 44 which are defined by the adjacent N+ diffusion layers 32 and 34. Although the polysilicon gate construction is preferred for many applications, the common gate strip 28 may be constructed of a conductive metalized layer or other conductive layer to form gate electrodes over the channel regions as illustrated in FIGS. 8 and 9 of the drawing.

Figure 4:
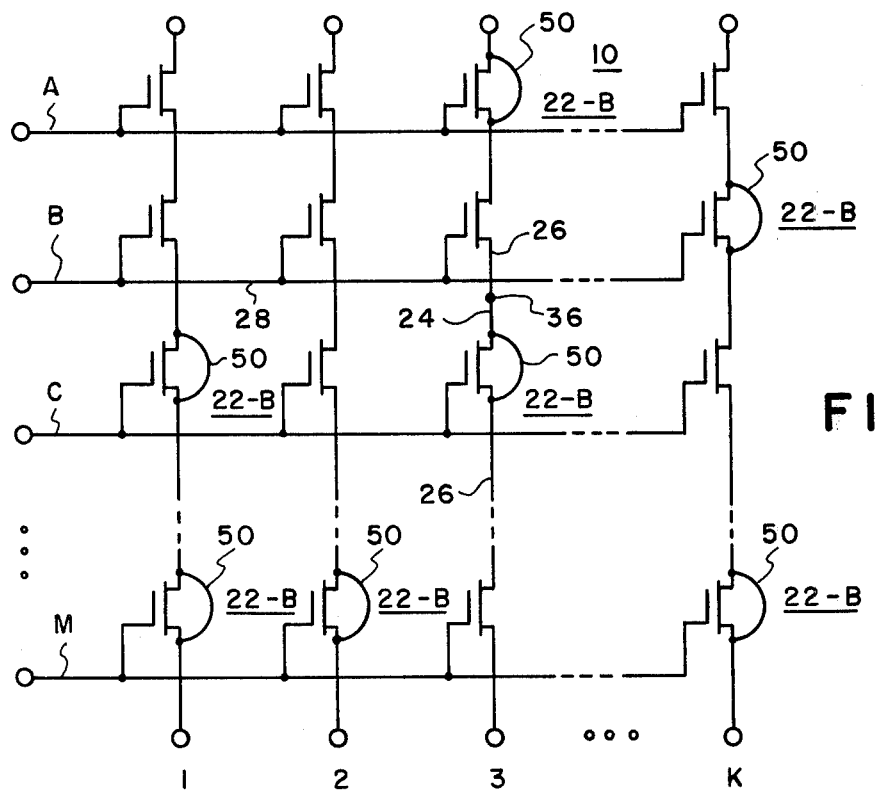
FIG. 4 is a circuit diagram of a logic matrix which is programmed by a diffused bridge region electrically inter-connecting the source and gate portions of predetermined ones of the MOSFET transistors within each output column.

An alternative programming arrangement is illustrated in FIG. 4 of the drawing in which transistor elements 22B are disposed at predetermined matrix locations to implement a given logic code. The transistor elements 22B are characterized by a conductive bridge region 50 which electrically interconnects the source and drain portions 24 and 26 of adjacent transistor elements within each column. The conductive bridge 50 serves essentially as a short circuit across the source and drain portions of the transistor elements 22B so that the conductive series path through the particular transistor element in question is not logically influenced by the logic state associated with the potential applied to the gate of the transistor element.

Figure 5:
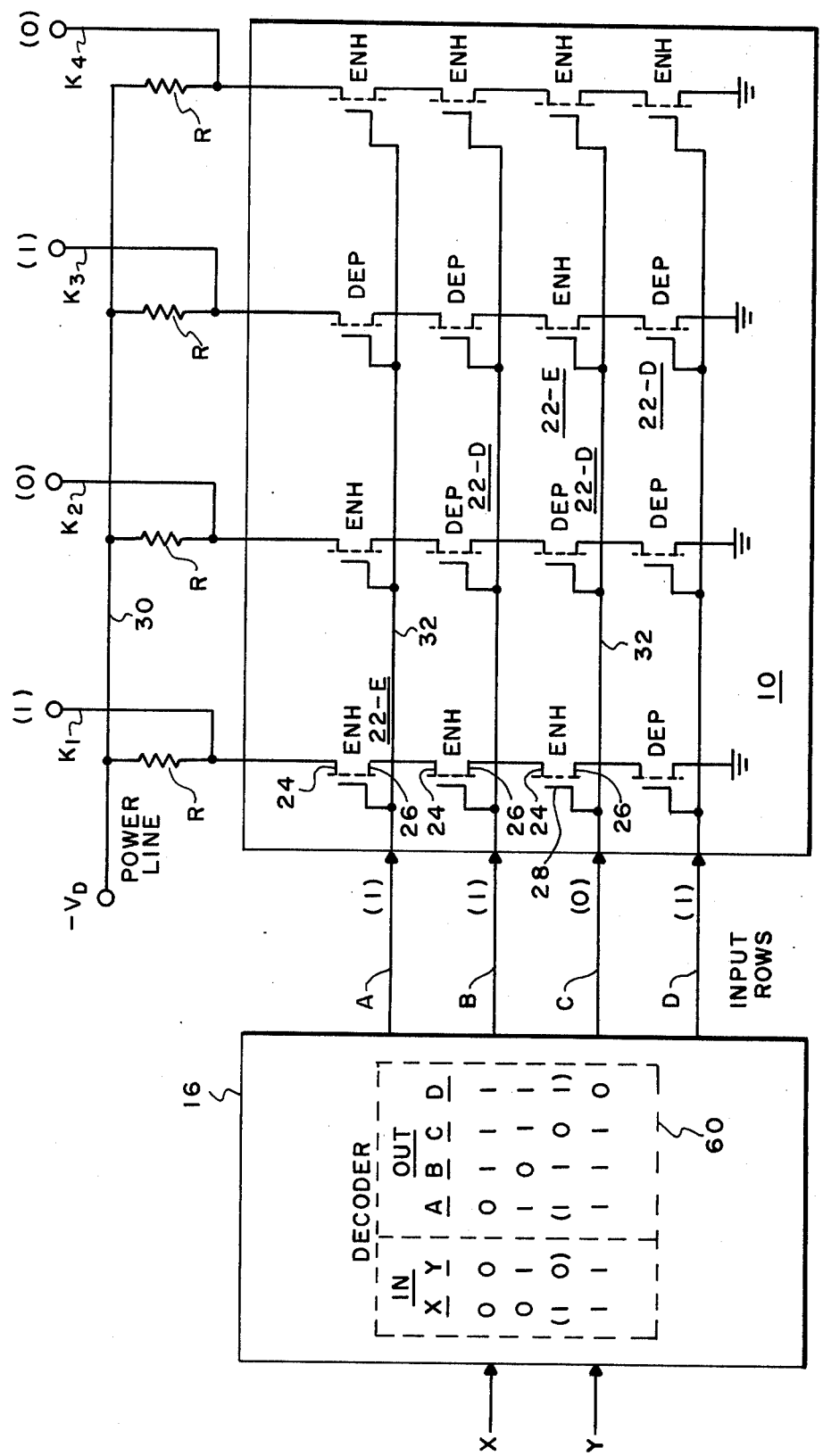
FIG. 5 is a simplified circuit diagram of a ROM constructed according to the teachings of the present invention.

Operation of a simple ROM matrix 10 which is constructed according to the teachings of the present invention will now be discussed in connection with the circuit illustrated in FIG. 5 of the drawing. The ROM matrix 10 has four intput rows A, B, C, and D and four output columns $K_1$, $K_2$, $K_3$, and $K_4$. The output of the address decoder 16 provides the digital input to the rows A-D according to a truth table 60. The read only memory (ROM) 10 comprises a plurality of enhancement mode (22E) and depletion mode (22D) N-channel MOS transistors which are arrayed in four input rows A-D and four output rows $K_1$, $K_2$, $K_3$, and $K_4$. The gates of the transistors 22E and 22D in each of the four input rows are common, the common gates forming the four inputs A, B, C, and D. The sources 24 and drains 26 of adjacent transistors in each of the output columns are connected in series electrical relation within each individual column with the enhancement mode transistors 22E and the depletion mode transistors 22D in each column connected together in series as driver elements, instead of in a parallel configuration corresponding to conventional NOR logic circuit arrangements. In this series arrangement, the depletion mode MOSFET transistors 22D function as low impedance connectors between the enhancement mode MOSFET transistors in each of the columns.

Each output column has four transistors, some of which may be enhancement mode devices and some of which may be depletion mode devices depending upon the particular program to be implemented. Reading the matrix array is accomplished by selectively bringing one row line to a potential which corresponds to a logic "0", typically about ground potential, and applying a "high" potential which corresponds to a logic "1" on the remaining row lines. If a particular column linecontains an enhancement mode transistor 22E whose gate is controlled by the selected row line, that series path is broken. On the other hand, if that column line contains a depletion transistor instead of an enhancement transistor, the series path remains unbroken. Differentiation between a logic "1" and a logic "0" is therefore accomplished by sensing whether the series output column path is open or conducting. For example, suppose that the address line of row input C is selected. This corresponds (according to the truth table 60) to an input (X, Y) equal to (1,0) from the address control signal 18. With row input "C" selected, a potential corresponding to a logic "1" appears at row inputs A, B, and D, while a potential corresponding to a logic "0" appears at row input "C". The enhancement mode transistors 22E contained within row C are turned off and become nonconductive. On the other hand, the depletion mode transistor 22D contained within row line C is continuously conductive because it is a depletion mode device and therefore is not logically influenced by the logic state which corresponds to the applied potential to the common gate 32 of row line C. Since the enhancement mode transistor 22E contained within input row line C and output column $K_1$ is nonconducting, the potential at $K_1$ becomes essentially $V_D$ volts, which corresponds to a logic "1". All of the enhancement mode and depletion mode transistors in output column $K_2$ are conducting because of the logic "1" potential applied to the enhancement mode transistor in input row A and the remaining transistors within the output column $K_2$ are depletion mode transistors. The potential at $K_2$ approaches substantially ground potential, which corresponds with a logic "0" condition. By similar analysis, the output column $K_3$ contains a logic "1", and output column $K_4$ contains a logic "1".

Figure 10:
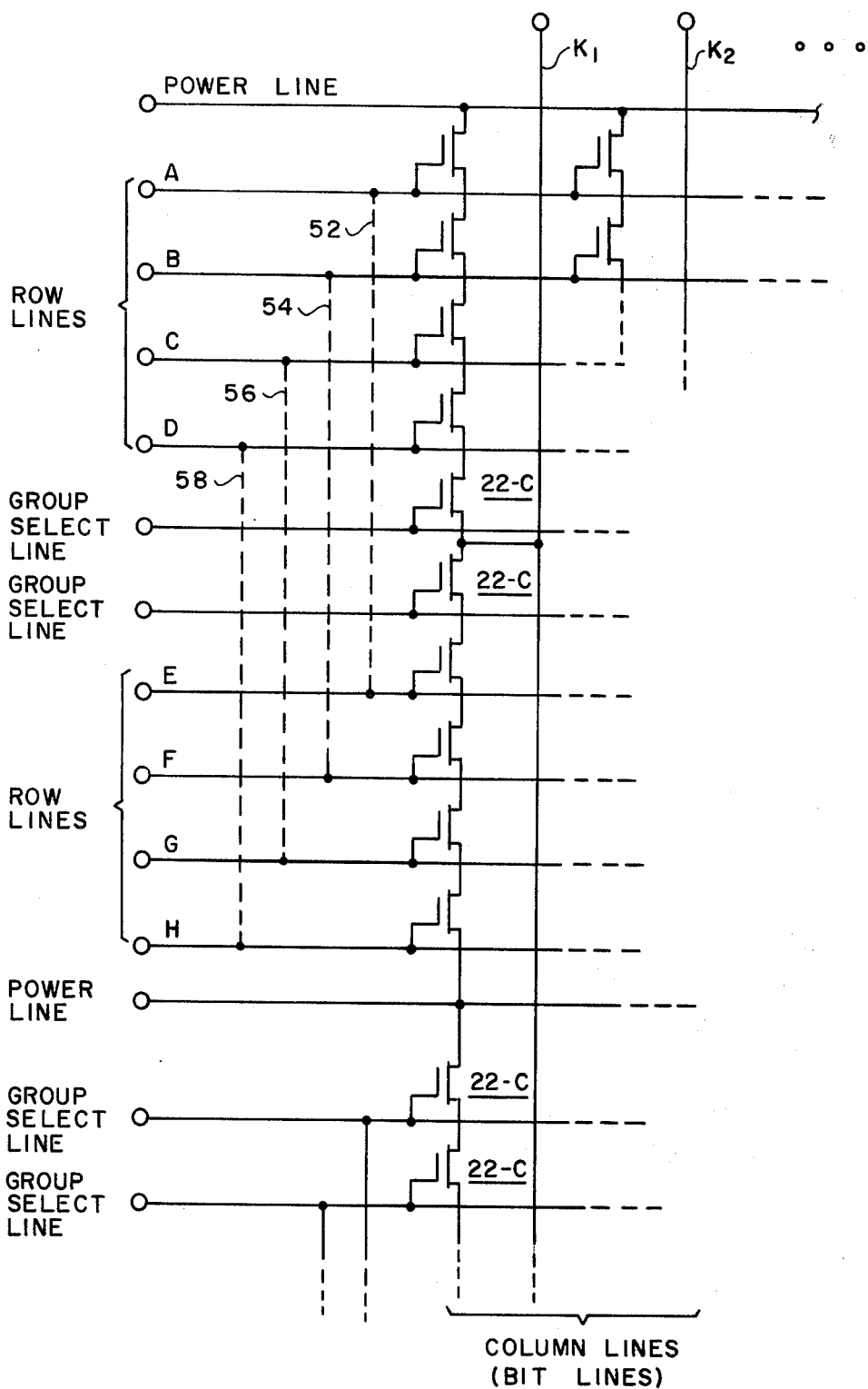

Requirements on the ROM may limit the number of MOSFET devices connected in any one series output column. This objection may be overcome by connecting several shorter series structures in parallel to form one bit line as illustrated in FIG. 10 of the drawing. The corresponding row lines are electrically interconnected by connecting means 52, 54, 56 and 58 indicated generally by the dashed lines. The connecting means may be formed by permanent conductive interconnects or they may be formed by conductive interconnects which are selectively switched according to a predetermined code. The output of each series group is selectively coupled together to form common output lines by suitable coupling means 22C, which may be an enhancement mode MOSFET.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A logic structure comprising:

A semiconductor substrate having a plurality of groups of field affect transistors formed at selected locations thereon, each of said transistors having portions defining a gate, a source, and a drain;

each group of transistors being arrayed in a set of input rows and a set of output columns;

the gates of the transistors in each output row being formed in common;

the drains of transistors within each output column being connected in series electrical relation to the sources of adjacent transistors in each output column, whereby a gate controlled, series conduction path is established through each output column of transistors in each group;

means for electrically connecting each corresponding input row of each group to form common input lines; and, means for selectively coupling corresponding output columns of each group to a common output line, said coupling means being responsive to a bias potential which corresponds to a selected logic state to electrically connect or disconnect its associated output column to or from the common output line.

2. The logic structure as defined in claim 1, wherein each transistor of each group is of a first or second type, the transistors of said first and second types including structurally differentiating portions which provide first and second modes of operation, respectively, each transistor of said first type being operable in said first mode to conduct current through its source and drain portions in response to an applied gate potential corresponding to a first logic state, and being operable to prevent the flow of current through its source and drain portions in response to an applied gate potential corresponding to a second logic state, whereby a gate controlled series conduction path is established in the output columns containing the transistors of said first type;

each transistor of said second type being operable in said second mode to conduct current through its source and drain portions independently of the logic state corresponding to its applied gate potential, whereby a series conduction path is established in each output column containing a transistor of said second type which is logically unresponsive to changes in the logic state corresponding to an applied gate potential.

3. The combination as defined in claim 2, at least a portion of the channel region of each transistor of said first type having ions implanted therein in a first concentration level of sufficient magnitude to permit operation of each transistor of said first type in said first mode, and at least a portion of the channel region of each transistor of said second type having ions implanted therein in a second concentration level of sufficient magnitude to permit operation of each transistor of said second type in said second mode.

4. The combination as defined in claim 3, wherein the ion impurities implanted in the channel region of each transistor of said first type are of a first conductivity type, and the ion impurities implanted in the channel region of each transistor of said second type are of the opposite conductivity type.

5. The combination as defined in claim 2, at least a portion of the channel region of each transistor of said first type having ion impurities implanted therein in a concentration level of sufficient magnitude to permit operation thereof in said first mode, the channel region of each transistor of the second type being devoid of ion impurities to permit operation thereof in said second mode.

6. The combination as defined in claim 2, the channel of each transistor of said first type being devoid of ion impurities to permit operation thereof in said first mode and at least a portion of the channel region of each transistor of said second type having ion impurities implanted thereof in a concentration level of sufficient magnitude to permit operation thereof in said second mode.

7. The combination as defined in claim 2, the drains and sources of adjacent transistors in each output column being formed by a common elongated diffused region within said substrate, the common elongated diffused regions of adjacent output columns extending substantially parallel to each other and defining a continuous channel region therebetween, the gates of the transistors in each input row being formed by a common conductive gate strip extending transversely with respect to the source and drain diffusion regions, and a layer of insulating material being disposed under the gate strips and over the channel regions defined by the adjacent source and drain regions.

8. The combination as defined in claim 7, said common conductive gate strip comprising a layer of polycrystalline silicon overlaying said channel region.

9. The combination as defined in claim 7, said common gate strip comprising a conductive metalized layer disposed on said layer of insulating material.

10. The combination as defined in claim 7, said insulating layer being sufficiently thin to establish transistors operable in said first mode at the intersection of each gate strip and the associated source and drain regions at the matrix locations corresponding to each transistor of said first type, and including a conductive bridge region electrically interconnecting the source and drain portions of each transistor of said second type.

* * * * *